ELECTRICAL CONNECTIONS TO SEMICONDUCTOR BODIES

Filed Nov. 16, 1956

INVENTOR
JOHN SPANOS
BY Elmer J. Gorn
ATTORNEY 2,982,893

ELECTRICAL CONNECTIONS TO SEMICONDUCTOR BODIES

John Spanos, Billerica, Mass., assignor to Raytheon Company, a corporation of Delaware Filed Nov. 16, 1956, Ser. No. 622,567
6 Claims. (Cl. 317—235)

This invention relates generally to the fabrication of electrical translating devices which comprise a body of semiconductive material having zones or regions therein where the material is of a different conductivity type, and more particularly to a novel method and means for establishing electrical connections to the semiconductive material.

Semiconductor devices are now known in which a chip or wafer of semiconducting material, such as germanium or silicon, is provided with significant impurity materials in order to form regions having different electrical conductivity characteristics. The conductivity type of the material depends upon whether the impurity material is a "donor" impurity which, upon replacing an atom in the crystal lattice of the semiconducting material, supplies an excess of electrons, and those designated as "acceptor" impurities, which result in a deficiency of electrons in the lattice structure. The former type supplies unbonded electrons which serve as negative mobile charge carriers, and the latter provide electron deficiencies or "holes" would serve as positive mobile charge carriers. A semiconducting material in which conduction by "holes" normally occurs is identified as P-type, whereas the type in which the principal conduction occurs by electrons is identified as N-type.

In the manufacture of these devices, it is necessary to establish an ohmic electrical connection to one or more of these regions depending upon the particular type of semiconductive device involved. For example, in one form, a device of this type may comprise a wafer of semiconductive material having two regions of the same conductivity type material, with a region of different conductivity type material intermediate the first two regions. The two regions of the same conductivity type material are provided with electrical connections thereto and these regions are designated as the emitter and the collector regions. The intermediate region is designated as the base region. The emitter and collector regions form rectifying connections, while the connection to the base region is an ohmic connection. In the art, such a device is commonly called a transistor.

The problem of making an ohmic or near ohmic contact to the semiconductive material, and especially to silicon, has been a troublesome one. Silicon, as a material, has an extremely low coefficient of expansion when compared to the coefficients of expansion of most materials and metals commonly used to make electrical connections. When attempts are made to utilize such materials in order to make a connection to silicon, this mismatch of coefficients results in stresses and strains being set up in the joint between the silicon and the connecting material which contribute to the formation of a weak mechanical connection therebetween, an obviously undesirable condition if a reliably useful device is to be produced. In addition to an appropriate coefficient of expansion property, the materials used in the connection should provide: a sufficiently high melting point if the high temperature characteristics of silicon as a semiconductor device material is to be taken advantage of; a proper valence relationship with respect to the silicon so that P or N doping does not occur in the ohmic connection; ready wetting of the silicon surface, preferably without the use of a flux; and finally, reasonable etch resistance to withstand the vagaries of chemical and electrolytic etching after assembly of the device. In the past, the methods and materials used to make the ohmic connection have often resulted in a connection which was inferior chiefly from the standpoint of mechanical strength and the range of temperature to which the device could be subjected in storage or operation without further weakening this connection. Accordingly, the present invention is directed toward an improved method and means for making such an ohmic connection wherein a tab of a nickel-cobalt-iron alloy is provided with a coating of nickel and an overlapping coating of lead, and the tab is then fired to the silicon chip to form a connection which exhibits superior performance characteristics than heretofore attainable.

The invention will be better understood as the following description proceeds taken in conjunction with the accompanying drawing wherein.

Figure 1:
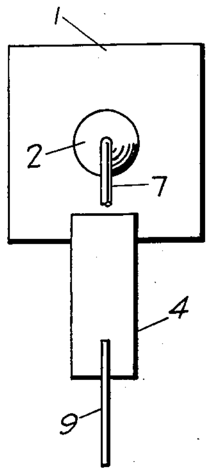
Fig. 1 is a greatly enlarged front view of a transistor showing the various electrical connections.
Figure 2:
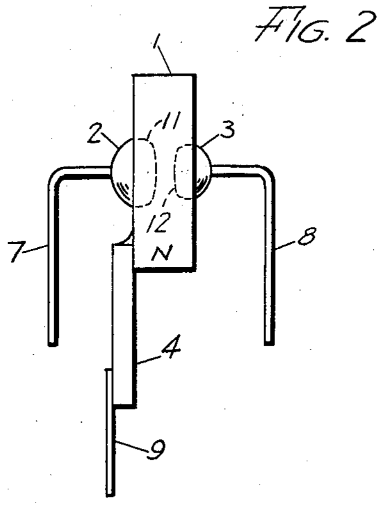
Fig. 2 is a greatly enlarged side view of the structure shown in Fig. 1.

Referring now to the drawing, and more particularly to Figs. 1 and 2 thereof, there is shown a semiconductive device comprising a chip 1 of semiconductive material, having two dots 2 and 3 of an impurity material fused to opposite sides thereof. The chip 1 may be N-type silicon, for example, sliced from a previously prepared N-type crystal prepared in a manner well known in the art. The dots 2 and 3 may comprise any P-type impurity material, such as aluminum, which have been fused into the opposite sides of the chip in a manner conventional in the art in order to form two P-type regions within the body of N-type chip 1. The boundaries between the P and N-type regions form P-N rectifying junctions 11 and 12. The chip 1 has a tab 4 fused to the N-type portion thereof. The dot 2 is designated as the emitter electrode, the dot 3 is designated as the collector electrode, and the tab 4 is designated as the base electrode, a device thus constructed being termed a P-N-P transistor.

Figure 3:
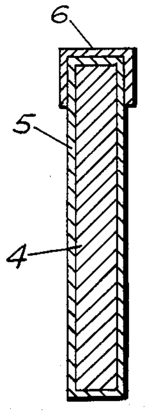
Fig. 3 is a greatly enlarged cross-sectional view of the base tab before it has been fused to the semiconducting chip.

In accordance with the present invention, the base connection provided by the tab 4 may comprise a nickel-cobalt-iron alloy, such as kovar, the surface of which is provided with a layer of metallic nickel 5, as shown in Fig. 3. The portion of the tab 4 which is to extend over the surface of chip 1 is provided with an additional layer of lead solder 6, or other suitable solder, superimposed upon the nickel layer 5.

In practicing the present invention, it has been found that the thickness of the nickel layer 5 is critical to the formation of a good quality ohmic connection, and preferably, is restricted to a thickness ranging between .01 and .5 of a mil. If too much nickel is used, the joint between the tab 4 and the wafer 1 will be undesirably brittle and will exhibit an undesirably high electrical resistance characteristic. With this in mind, the nickel layer is preferably applied to the tab 4 in a manner which will insure proper control of the thickness of the nickel layer 5. This has been successfully accomplished by plating the nickel layer 5 onto the tab 4. After the nickel layer 5 has been placed on the tab 4, the lead layer 6 may then be applied to the portion of the tab which is to extend over the surface of the chip 1 in any conventional manner, as by dipping the nickel-coated tab 4 into a receptacle containing molten lead. After the tab 4 has been thus prepared, it may be placed in contact with the chip 1 in a suitable tray along with the dots 2 and 3, and the whole assembly may then be subjected to a temperature sufficient to cause the dots 2 and 3 to alloy onto the chip 1 to form the two P-type regions, and, simultaneously, fuse the tab 4 to the N-type portion of the chip 1. This temperature may range from about 800 to about 1,000° C. The lead wires 7, 8 and 9 may then be connected, respectively, to the dot 2, dot 3 and tab 4 in order to provide the external connections of the device. The device shown in Figs. 1 and 2 may then be subjected to final etching and packaging in well known ways in order to produce a finished unit.

It has been found that the use of a base tab prepared in accordance with the above-described procedure provides a greatly improved ohmic connection to silicon. The coefficient of expansion of the tab 4 is sufficiently close to silicon, so that any strains which are developed are not a serious enough matter to be objectionable, thereby resulting in a considerably stronger mechanical connection than heretofore realizable. The nickel plating allows the lead 6 to wet the tab 4 and to assist in the wetting of the lead 6 to the silicon chip 1, particularly with small area contacts, and to harden the lead 6 thereby improving its shear strength when a force is applied between the tab 4 and the chip 1. Although the reasons for the added strength are not fully understood, it would appear that the small difference in coefficient of expansion between the tab 4 and the chip 1 plus the fact that the major area of the contact between the lead 6 and the silicon lies under the tab 4 leaving only the exposed edges to develop the major strain, explains the solution to the cracking problem. It should also be noted that attempts to fabricate a nickel-lead solder to eliminate the operation of plating the nickel onto the tab 4 were unsuccessful due primarily to excessive drossing of the solder.

It can thus be seen that a nickel-cobalt-iron alloy, plated with nickel, and tinned with lead, provides means for making an ohmic connection to silicon which can be fired to temperatures as high as about 1,000° C. with no cracking, excellent mechanical strength, excellent wetting of the silicon, relatively high melting point of the connection (332° C.), and good etch resistance to the usual hydrofluoric nitric acid etches. It should also be noted that, although the present invention is particularly useful with respect to silicon, it is equally successful when used on germanium, but since the difference between the coefficient of expansion of germainum and the commonly used connecting materials is not as great as the same difference with respect to silicon, the problem is not as acute with germanium.

Although there has been described what is considered to be a preferred embodiment of the present invention, various adaptations and modifications thereof may be made without departing from the spirit and scope of the invention as defined in the appended claims.

What is claimed is:

1. An electrical translation device comprising a body of semiconductive material selected from the group consisting of germanium and silicon and having a plurality of electrodes in contact therewith, one of said electrodes comprising a tab of a nickel-cobalt-iron alloy physically connected to said body and having a coating of metallic nickel thereon, said nickel coating having a thickness ranging from about .01 of a mil to about .5 of a mil.

2. An electrical translation device comprising a body of silicon having an emitter electrode, a collector electrode, and a base electrode in contact therewith, said base electrode comprising a tab of a nickel-cobalt-iron alloy physically connected to said body and having a coating of metallic nickel thereon, said nickel coating having a thickness rainging from about .01 of a mil to about .5 of a mil.

3. An electrical translation device comprising a body of semiconductive material selected from the group consisting of germanium and silicon, said body having a plurality of electrodes in contact therewith, one of said electrodes comprising a tab of a material having a coefficient of thermal expansion substantially comparable to that of said body, said tab being physically connected to said body by bonding material which includes lead and nickel, said nickel having been derived from a nickel coating applied to said tab and having a thickness ranging from about .01 of a mil to about .5 of a mil.

4. An electrical translation device comprising a body of semiconductive material selected from the group consisting of germanium and silicon, said body having a plurality of electrodes in contact therewith, one of said electrodes comprising a tab of a material having a thermal coefficient of expansion substantially comparable to that of said body, said tab having one end physically connected to said body by a bonding material which includes lead and nickel, the remaining portion of said tab overhanging said body and being out of physical contact with said body, said nickel having been derived from a nickel coating applied to said tab and having a thickness ranging from about .01 of a mil to about .5 of a mil.

5. The method of making a substantially ohmic connection to a body of semiconductive material, said method comprising providing at tab of a nickel-cobalt-iron alloy, applying a layer of metallic nickel on said tab of a thickness ranging from about .01 of a mil to about .5 of a mil, superimposing a layer of solder on said nickel layer, placing said tab in contact with said body, and fusing said tab to said body.

6. The method of making a substantially ohmic connection to a body of semiconductive material as described in claim 5, wherein said semiconductive material is silicon.

References Cited in the file of this patent

UNITED STATES PATENTS

| | | |
|---|---|---|
| 2,662,997 | Christensen | Dec. 15, 1953 |
| 2,731,704 | Spanos | Jan. 24, 1956 |
| 2,763,822 | Frola et al. | Sept. 18, 1956 |
| 2,793,420 | Johnston et al. | May 28, 1957 |
| 2,796,563 | Ebers et al. | June 18, 1957 |
| 2,809,332 | Sherwood | Oct. 8, 1957 |